(12) United States Patent
Chuang et al.

(10) Patent No.: US 6,431,910 B1
(45) Date of Patent: Aug. 13, 2002

(54) CONTACT DEVICE USED IN HEAT-DISSIPATING DEVICE FOR HOT SWAP

(75) Inventors: Te-Tsai Chuang; Kuo-Cheng Lin, both of Taoyuan Shien (TW)

(73) Assignee: Delta Electronics, Inc., Taoyuan Shien (TW)

( * ) Notice: Subject to any disclaimer, the term of this patent is extended or adjusted under 35 U.S.C. 154(b) by 0 days.

(21) Appl. No.: 09/502,695

(22) Filed: Feb. 11, 2000

(30) Foreign Application Priority Data

Oct. 28, 1999 (TW) ...................................... 88218346 U

(51) Int. Cl.[7] ........................ H01R 33/945; F01D 25/00
(52) U.S. Cl. ........................................ 439/577; 415/220
(58) Field of Search .............................. 439/502, 506, 439/577, 527, 660, 928; 361/695, 697; 415/220, 228

(56) References Cited

U.S. PATENT DOCUMENTS

| | | | | |
|---|---|---|---|---|
| 3,644,066 A | * | 2/1972 | Heob et al. | 417/354 |
| 4,098,547 A | * | 7/1978 | Wrobel | 439/527 |
| 4,160,576 A | * | 7/1979 | Vettori | 439/527 X |
| 4,636,669 A | * | 1/1987 | Plunkett et al. | 415/119 X |
| 5,452,181 A | * | 9/1995 | Hoover | 361/697 |
| 6,190,197 B1 | * | 2/2001 | Polgar et al. | 439/527 |

* cited by examiner

Primary Examiner—John E. Ryznic
(74) Attorney, Agent, or Firm—Michael Best & Friedrich LLC; Laff, Whitesel & Saret, Ltd.; J. Warren Whitesel

(57) ABSTRACT

Disclosed is a contact device adapted to be mounted on a heat-dissipating device for hot swap in a system. The contact device includes a main body having a resilient member protruding from one side thereof, a conductive member disposed in the main body for electrically connecting the heat-dissipating device and the system, and a first engaging member disposed on the resilient member for engaging with a second engaging member of the heat-dissipating device to allow the main body to be detachably mounted on the heat-dissipating device.

17 Claims, 4 Drawing Sheets

CONTACT DEVICE USED IN HEAT-DISSIPATING DEVICE FOR HOT SWAP

FIELD OF THE INVENTION

The presisent invention is related to a contact device of a heat-dissipating device for hot swap, and particularly to a contact device of a fan for hot swap.

BACKGROUND OF THE INVENTION

The fan, which is a commonly used heat-dissipating device, is applied to the system which generates heat when said system is in operation. The fan dissipates the heat by generating airflow to maintain said system in normal working condition.

Please refer to FIG. 1 which is a schematic diagram showing a conventional fan for hot swap. The conventional fan 11 includes a conductive wire 12 for connecting the conventional fan 11 and the terminal 13 by welding. Then, the terminal 13 is electrically connected to the system 14 to perform the function of hot swap. Particularly, it is much easier that the conductive wire 12 is directly welded to the system 14 from the convential fan 11.

However, the above-mentioned conventional fan for hot swap has the following disadvantages. First of all, the conventional fan 11 must be so securely immobilized that it's not convenient to replace the fan in case of malfunction. In addition, the compatibility of the conventional fan 11 and the terminal 13 may be a problem so that the cost is high.

SUMMARY OF THE INVENTION

An object of the present invention is to provide a simple contact device of the heat-dissipating device, which is easily assembled with and disassembled from the heat-dissipating device.

Another object of the presention invention is to provide a contact device of the heat-dissipating device to allow the fan to be detachably assembled with the system.

According to the present invention, the contact device, adapted to be mounted on a heat-dissipating device for hot swap in a system, includes a main body having a resilient member protruding from one side thereof, a conductive member disposed in the main body for electrically connecting the heat-dissipating device and the system, and a first engaging member disposed on the resilient member for engaging with a second engaging member of the heat-dissipating device to allow the main body to be detachably mounted on the heat-dissipating device.

The main body is generally crossectionally L-shaped. Preferably, the main body is made of insulating material and can be integrally formed by way of injection molding. Further, the resilient member includes two resilient pieces protruding from two opposite sides of the main body, respectively.

The conductive member may include a plurality of contact terminals welded to a conductive wire of the heat-dissipating device by respective one end thereof. Besides, the other ends of the plurality of contact terminals are respectively electrically connected with the system. Preferably, the conductive member is integrally formed with said main body.

The first engaging member is a protuberance for engaging with the second engaging member of the heat-dissipating device to allow the main body to be securely mounted on the heat-dissipating device. Correspondingly, the second engaging member is a concavity for receiving the first engaging member.

On the contrary, while the second engaging member of the heat-dissipating device is a protuberance for engaging with the first engaging member, the first engaging member is a concavity for receiving the second engaging member.

Another further object of the present invention is to provide a fan assembly adapted to be used for hot swap in a system. The fan assembly includes a rotor device for generating a revolving airflow to dissipate heat from a system, a fan guard for protecting and supporting the rotor device, and a contact device detachably mounted on the fan guard and having a conductive member for electrically connecting the rotor device and the system.

The present invention may best be understood through the following description with reference to the accompanying drawings, in which:

DETAILED DESCRIPTION OF THE PREFERRED EMBODIMENTS

The present invention will now be described more specifically with reference to the following embodiments. It is to be noted that the following descriptions of preferred embodiments of this invention are presented herein for purpose of illustration and description only; it is not intended to be exhaustive or to be limited to the precise form disclosed.

Herein, the present invention is illustrated by using a fan as a heat-dissipating device.

Figure 1:
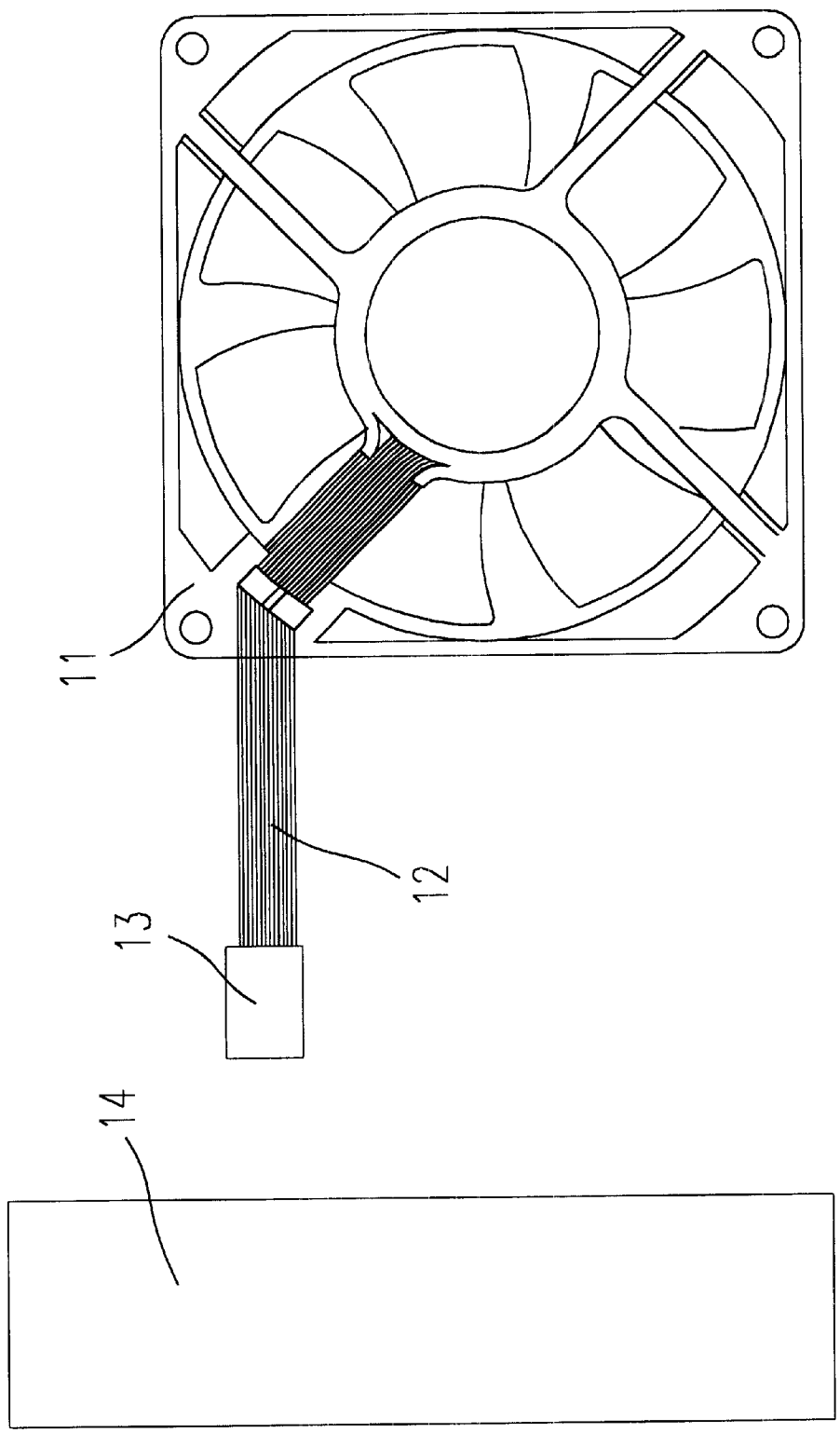
FIG. 1 is a schematic diagram schematically showing a conventional fan for hot swap.
Figure 2:
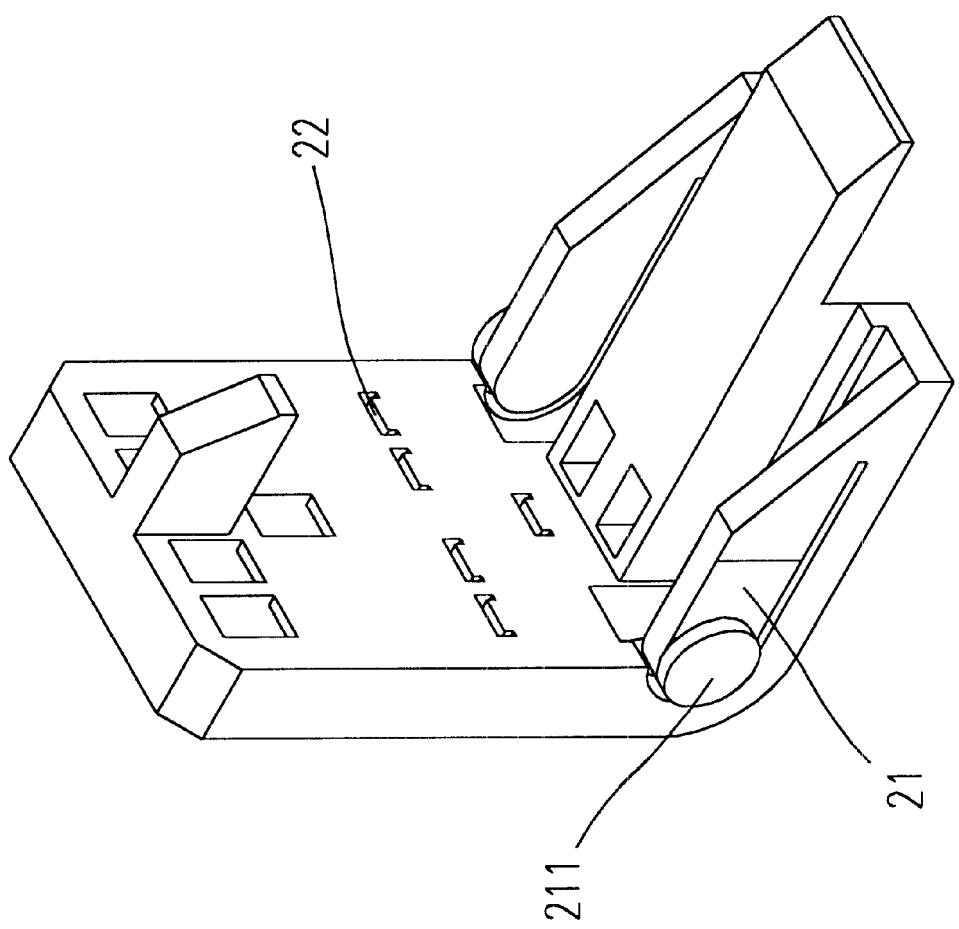
FIG. 2 is a perspective diagram showing a preferred embodiment of a contact device according to the present invention.

Please refer to FIG. 2 which is a perspective diagram schematically showing a preferred embodiment of a contact device according to the present invention. The contact device is generally crossectionally L-shaped, which is designed for corresponding to the shape of the fan assembly. The resilient member 21 includes two resilient pieces protruding from two opposite sides of the main body 23, respectively. And, the first engaging member 211 is a protuberance, protruded from the resilient member 21. When the contact device is mounted on the heat-dissipating device, the first engaging member 211 is pressed inwardly to the second engaging member 321 as shown in FIG. 3.

Figure 3:
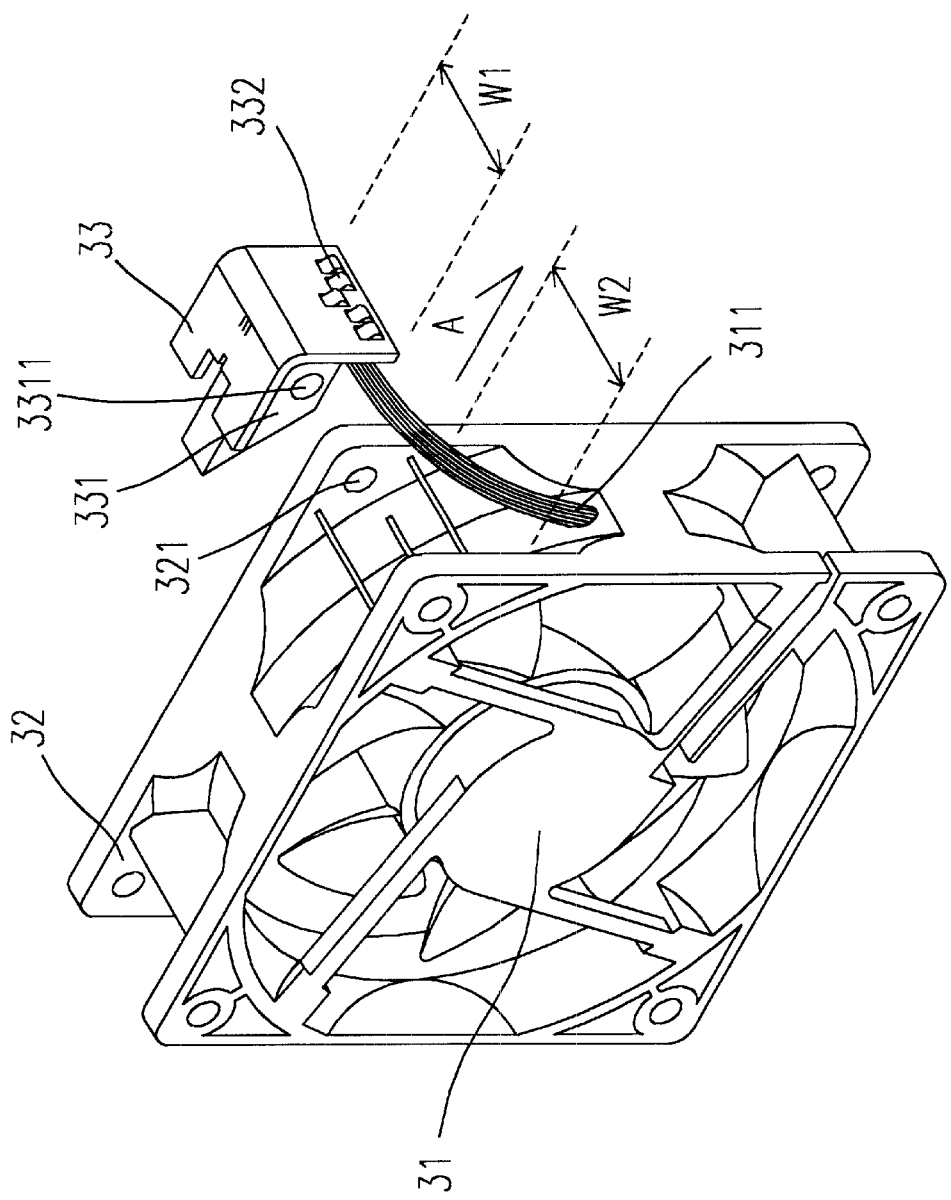
FIG. 3 is an exploded diagram schematically showing a preferred embodiment of a contact device assembled with a fan for hot swap according to the present invention.

Please refer to FIG. 3 which is an exploded diagram schematically showing a preferred embodiment of the contact device disassembled from a fan for hot swap according to the present invention. The fan 31 includes a fan guard 32, which has the second engaging member 321 on it. The second engaging member 321 is a concavity for receiving the first engaging member 3311 when the contact divice 33 is assembled with the fan 31. In fact, the conductive wire 311 must be welded from the fan 31 to the conductive member 332 in advance, then the contact device 33 may be mounted on the fan 31. Owing to that the width of the contact device WI is a little bit narrow than that of the fan guard 32 and the protuberance 3311 on the resilient member 331 is protruded much, the resilient member 331 is pressed when the contact device 33 is mounted on the fan guard 32. Then, the contact device 33 can be securely mounted on the fan guard 32 untill the first engaging member 3311 just engages with the second engaging member 321 by the elasticity of the resilient member 331.

Figure 4:
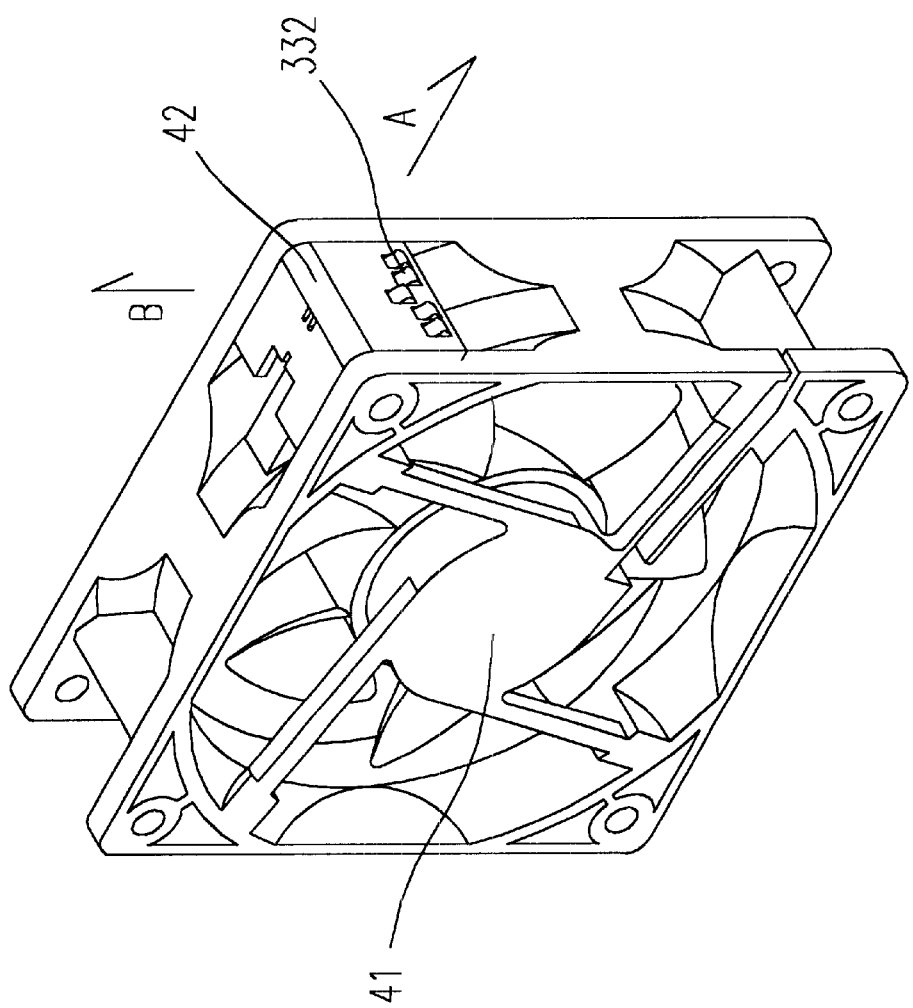
FIG. 4 is a perspective diagram schematically showing a preferred embodiment of a contact device assembled with a fan for hot swap according to the present invention.

Please refer to FIG. 4 which is a perspective diagram schematically showing a preferred embodiment of the contact device assembled with a fan for hot swap according to the present invention. The fan 41 and the contact device 42 become a fan assembly after the contact device 42 is mounted on the fan 41. Then, the fan assembly can be detachably and electrically assembled with a system by the conductive member 421. In fact, two directions of the contact device, e.g. direction A and direction B, are acceptable in order to accord with the arrangement of space when the contact device 42 is assembled with the fan 41.

In, conclusion, the compatibility of the fan and the contact device can't be a problem as long as the fan has it's own fan guard with a standard size. Moreover, the fan assembly for hot swap is convinently maintained after the contact device is mounted on the fan.

While the invention has been described in terms of what are presently considered to be the most pratical and preferred embodiments, it is to be understood that the invention need not be limited to the disclosed embodiment. On the contrary, it is intended to cover various modifications and similar arrangements included within the spirit and scope of the appended claims which are to be accored with the broadest interpretation so as to encompass all such modifications and similar structures. Therefore, the above description and illustration should not be taken as limiting the scope of the present invention which is defined by the appended claims.

What is claimed is:

1. An contact device adapted to be mounted on a heat-dissipating device for hot swap in a system, comprising:
   a main body having a resilient member protruding from one side thereof;
   a conductive member disposed in said main body for electrically connecting said heat-dissipating device and said system; and
   a first engaging member disposed on said resilient member for engaging with a second engaging member of said heat-dissipating device to allow said main body to be detachably mounted on said heat-dissipating device,
   wherein said conductive member includes a plurality of contact terminals electrically connected with said system.

2. The contact device according to claim 1 wherein said main body is made of insulating material.

3. The contact device according to claim 1 wherein said main body is generally crossectionally L-shaped.

4. The contact device according to claim 1 wherein said contact terminals are welded to a conductive wire of said heat-dissipating device by one end thereof.

5. The contact device according to claim 4 wherein the other ends of said plurality of contact terminals are respectively electrically connected with said system.

6. The contact device according to claim 1 wherein said conductive member is integrally formed with said main body.

7. The contact device according to claim 1 wherein said resilient member includes two resilient pieces protruding from two opposite sides of said main body, respectively.

8. The contact device according to claim 1 wherein said first engaging member is a protuberance for engaging with said second engaging member of said heat-dissipating device to allow said main body to be securely mounted on said heat-dissipating device.

9. The contact device according to claim 8 wherein said second engaging member is a concavity for receiving said protuberance.

10. A fan assembly adapted to be used for hot swap in a system, comprising:
    a rotor device for generating a revolving airflow to dissipate heat from a system;
    a fan guard for protecting and supporting said rotor device; and
    a contact device detachably mounted on said fan guard and having a conductive member for electrically connecting said rotor device and said system, said conductive member including a plurality of contact terminals electrically connected with said system,
    wherein said contact device includes a main body having a resilient member protruding from one side thereof, and a first engaging member disposed on said resilient member for engaging with a second engaging member of said fan guard to allow said main body to be detachably mounted on said fan guard.

11. The contact device according to claim 10 wherein said contact terminals are welded to a conductive wire of said heat-dissipating device by one end thereof.

12. The contact device according to claim 11 wherein the other ends of said plurality of conatct terminals are respectively electrically connected with said system.

13. The contact device according to claim 10 wherein said resilient member includes two resilient pieces protruding from two opposite sides of said main body, respectively.

14. The contact device according to claim 10 wherein said first engaging member is a protuberance for engaging with said second engaging member of said fan guard to allow said main body to be securely mounted on said fan guard.

15. The contact device according to claim 14 wherein said second engaging member is a concavity for receiving said protuberance.

16. A contact device adapted to be used with an electronic device to be electrically connected with a system, comprising:
    a main body having a resilient member protruding from one side thereof;
    a conductive member disposed in said main body for electrically connecting said electronic device and said system; and
    a first engaging member disposed on said resilient member for engaging with a second engaging member of said electronic device to allow said main body to be detachably mounted on said electronic device,
    wherein said conductive member includes a plurality of contact terminals welded to a conductive wire of said heat-dissipating device by one end thereof.

17. The contact device according to claim 16 wherein said electronic device is a heat-dissipating device.

* * * * *